United States Patent [19]

Fierkens et al.

[11] Patent Number: 4,534,921
[45] Date of Patent: Aug. 13, 1985

[54] METHOD AND APPARATUS FOR MOLD CLEANING BY REVERSE SPUTTERING

[75] Inventors: Richardus H. J. Fierkens, Herwen; Ireneus J. T. M. Pas, Rozendaal, both of Netherlands

[73] Assignee: ASM Fico Tooling, b.v., Herwen, Netherlands

[21] Appl. No.: 586,853

[22] Filed: Mar. 6, 1984

[51] Int. Cl.$^3$ .................. B29C 6/04; C23C 15/00
[52] U.S. Cl. .................. 264/39; 204/192 E; 204/298; 264/272.17; 425/116; 425/226; 425/227
[58] Field of Search .................. 264/39, 272.17; 425/116, 225, 226, 227; 204/192 E, 192 R, 298

[56] References Cited

U.S. PATENT DOCUMENTS

| | | | |
|---|---|---|---|
| 3,233,137 | 2/1966 | Anderson et al. | 204/192 E |
| 3,654,108 | 4/1972 | Smith, Jr. | 204/192 E |
| 3,968,018 | 7/1976 | Lane et al. | 204/298 |
| 4,278,493 | 7/1981 | Petrai | 204/192 E |
| 4,313,815 | 2/1982 | Graves, Jr. et al. | 204/192 R |

FOREIGN PATENT DOCUMENTS

2104827  3/1983  United Kingdom ........... 264/272.17

Primary Examiner—James Lowe
Attorney, Agent, or Firm—Weiss & Holloway

[57] ABSTRACT

A method and apparatus for cleaning at least selected surfaces of a mold apparatus to remove plastic residue and surface contaminates and impurities to enable the molds to be used in a continuous in-line type process for encapsulating lead frame assemblies or similar semi-conductor circuits. After the molds are separated and the large pieces of excess plastic are broken away, they are transported to a vacuum chamber and electrically coupled as, or at least proximate, the cathode. The vacuum chamber is evacuated and an inert ionizable gas such as argon is admitted. An electrical field is established between the anode and cathode to create a plasma or glow discharge causing the gas to ionize. The positive ions are accelerated by the electrical field toward the cathode and bombard at least selected areas of the mold portion to be cleaned for removing surface contaminates and producing an extremely clean surface to enable the mold portion to be used again and again in a continuous cyclical or in-line process. Portions of the mold surface which are not to be bomdarded by ions, may be masked or shielded during the reverse sputtering operation.

20 Claims, 7 Drawing Figures fig. 1 fig. 2 fig. 7 fig. 6

METHOD AND APPARATUS FOR MOLD CLEANING BY REVERSE SPUTTERING

BACKGROUND OF THE INVENTION

1. Field of the Invention

This invention relates generally to a method and apparatus for cleaning molds and, more particularly, to a method and apparatus for cleaning the top and bottom mold portions used for encapsulating the integrated circuit and lead portion of a lead frame assembly with plastic material by ion bombardment from a reverse sputtering operation.

2. Description of the Prior Art

The prior art includes many different methods and types of apparatus for producing integrated circuits and for producing lead frames for carrying the integrated circuits. In such systems, the integrated circuit is positioned, generally centrally, within the lead frame to form a lead frame assembly and the input/output leads of the integrated circuit itself are electrically coupled to the leads of the lead frame assembly. The central portion of the lead frame assembly including the integrated circuit portion and the leads into and out from the integrated circuit are then encapsulated in plastic, ceramic, or the like so that only the lead pins or terminals protrude or extend from the encapsulating material.

Various methods and types of apparatus can be used for performing the encapsulation operation. A typical in-line, continuous system includes positioning the previously-formed integrated circuit within the central portion of the lead frame and effecting the necessary electrical connections. The lead frame assembly is then positioned in a bottom mold portion and the top mold portion is positioned thereover. The plastic material is fed or supplied into the mold cavity and heat and pressure are applied to reduce the plastic material to a molten state and cover the central integrated circuit and lead portion of the lead frame assembly. The encapsulated lead frame assembly is then cured and the top mold portion separated from the bottom mold portion prior to removal of the lead frame assembly. The top mold portion and bottom mold portion are then subjected to some type of physical/mechanical and/or chemical cleaning operation prior to reuse for subsequent encapsulation operations. The lead frame assembly removed from the bottom mold portion is then forwarded for further processing or the like.

The prior art techniques for mechanical and/or chemical mold cleaning often produce many significant problems, particularly when a continuous in-line operation is to be maintained.

The molds used in an encapsulation operation may be made from various types of metal although stainless steel is generally preferable. The cleaning of the metal mold portions generally involve the removal of undesirable encapsulating materials, dirt, dust, greast, oil, etc. lying on the various mold surfaces. The cleaning must include not only the removal of all visible dirt from the surfaces, but also the subsequent removal of all contaminates and impurities physically stuck or adhered on the surface such as oil, grease, dust, and the like or those contaminates or impurities resulting from a chemical reaction such as oxides, sulfides, and the like. The degree of cleanliness must be very high when dealing with semiconductor circuits since contamination prior to encapsulation often results in an inferior or non-functional product.

The oxides and other similar surface layers can be removed by mechanical and/or chemical methods such as abrasive blasting, wire brushing, pickling and etching. The cleaning of oils and greases depends upon their particular nature and wheather or not they are soap-forming oils and greases of animal or vegetable origin, or mineral oils which do not form soaps. The soap-forming oils and greases can be removed by transforming them by hydrolysis into fatty acids and by reacting those acids with alkaline solutions to obtain water soluble soaps. The mineral oils can be removed by dissolving them in organic solvents and, in particular cases, they can be washed with alkaline solutions containing detergents. Since the nature of the contaminates is usually unknown, a single reliable cleaning operation must include at least the successive steps of degreasing with organic solvents followed by alkaline degreasing.

The sequence of cleaning operations begins generally with mechanical cleaning and has usually been followed by pickling, detergent cleaning and degreasing. The mechanical cleaning methods often used in the prior art for the purpose of removing scale, rust, plastic residue, and the like often included blasting or wire brushing the mold surface. This could obviously result in damage to the mold portions themselves as well as in forming surface defects in the mold which could cause damage to the encapsulated circuit or in reducing the life of the mold.

A pickling operation is the chemical removal of oxides, sulfides, $CH_4$ and other surface layers, leaving the cleaned part with a generally bright metallic appearance. The particular pickling solution used depends upon the particular metal used in the mold portions and in the primary substances being removed. After pickling, the part must always be thoroughly rinsed and subsequently neutralized in an alkaline bath and then dried with hot oil-free air. This results in a great loss in time, an increase in expense, and the destruction or at least undermining of any proposed continuous in-line molding operation.

Alkaline detergent cleaning is performed by immersion or by electro-cleaning processes. The immersion cleaning method is usually used with hot solutions. For ferrous metals, the solution generally contains sodium hydroxide, soaps and wetting agents and for electro-cleaning, an alkaline solution can be used with the metal to be cleaned used as the cathode or the anode and a tank being the second electrode. With anodic cleaning, oxygen is liberated on the surface of the metal being cleaned, and the process requires relatively low voltage. With cathodic cleaning, hydrogen is liberated on the clean surface, and the process requires a similar relatively low voltage. For stainless steel and the like, anodic cleaning is recommended but again, it is very costly, slow and detrimental to maintaining a continuous in-line molding process.

Solvent cleaning has been done by using the solvent in a liquid or in a vapour state. Liquid cleaning can be done with benzine, xylene, or inflammable solvents such as carbon tetrachloride, trichlorethylene, perchlorethylene, or dichlorethylene.

Vapor degreasing is much more effective than liquid solvent cleaning, but again, it requires additional cost, loss of time, and complex apparatus. The solvent must be heated to boiling and the parts to be cleaned must be hung within the chamber suspended in the hot vapor which condenses on the metal surfaces, dissolves the surface contaminates, and then flows or falls back into the solvent container. Systems have also been proposed which utilize high-pressure liquid solvent spraying or the like which may increase the overall time of the operation and further add to the expense.

Therefore, the various mechanical and/or chemical cleaning methods of the prior art do not produce the quality of cleanliness required when dealing with semiconductor circuits; are not conducive to continuous in-line molding operations; are too expensive; too mechanical and/or electrically complex; require excess maintenance; and result in cumulative damage to the relatively expensive top and bottom mold portions.

The phenomenon of DC sputtering or cathodic sputtering refers to the dislocation or removal of atoms or molecules from the surface of a material by the impact energy of gas ions which are accelerated in an electric field. Cathodic sputtering is established by the creation of a glow discharge or plasma between an anode and a cathode wherein the current therebetween is composed of electron flow to the anode and positive ion flow to the cathode. The ions are created by the ionization of gas molecules existing within the flow discharge region between the anode and cathode. The ionization results from the collision of gas particles with the electron flow from the cathode to the anode. Sputtering is used extensively for depositing thin films of semiconductor material, metal, and the like on various surfaces.

The removal of surface contaminates by cathodic sputtering is known in the art, at least for theoretical or laboratory-type operations, and is referred to as "reverse sputtering" since it is the opposite of the process of cathodic sputtering itself wherein substances are deposited onto the surface of a material. For example, reverse sputtering removes material from a surface as observed in electric-arc-inert-gas welding applications wherein contaminates are removed from the surface of the materials to be welded prior to the actual weldment.

Reverse sputtering has been used in the prior art to clean relatively large surface areas of semiconductor material as a preliminary step in the manufacture of semiconductor devices such as photoelectric cells, and the like. Furthermore, reverse sputtering has been used to clean the actual apparatus used in cathodic sputtering operations and in various applications such as cleaning accelerators, storage rings, and plasma machines.

The prior art also teaches relatively delicate apertured masking techniques for selectively cleaning small selected areas of a material while shielding or masking other areas to prevent ion bombardment of the shielded or masked surface.

Because of the extreme delicacy of the method and apparatus of sputter cleaning or reverse sputtering to clean semiconductor circuits, and the like, and due to the inaccuracy of masking techniques, prior art attempts have usually resulted in a return to known physical abrasive cleaning techniques and/or chemical cleaning techniques such as etchants, abrasive microcloth, and the like. The use of these methods, however, does not achieve a uniform cleaning of the surface area, and such methods are particularly ineffective, unsatisfactory, or difficult with mold apparatus wherein the mold recesses present relatively small, intricate, well-defined areas of restricted size and confinement which are extremely difficult to clean by such prior art methods. Furthermore, such cleaning techniques often result in damage to the work piece and hence damage to the product produced in the mold assembly.

The method and apparatus of the present invention solve relatively all of the problems listed above and provide a relatively low cost, extremely simple, easy to maintain, highly efficient, system usable in continuous in-line molding or encapsulation systems.

SUMMARY OF THE INVENTION

It is an object of the present invention to provide a method and apparatus for removing plastic residue from the top and bottom mold portions used to encapsulate the integrated circuit and lead portion of a lead frame assembly with plastic material prior to reuse of the mold portion.

It is another object of the present invention to use a reverse sputtering operation to clean molds in an in-line operation for lead frame assembly encapsulation.

It is still another object of the present invention to provide a method and apparatus usable in a continuous, in-line process for molding plastic material about portions of a lead frame apparatus and encapsulating same for cleaning the mold surfaces after the encapsulated lead frame assembly is removed from the mold and prior to mold reuse.

It is yet another object of the present invention to provide an improved method and apparatus for cleaning mold surfaces by the ion bombardment produced from a reverse-sputtering operation.

It is still a further object of the present invention to eliminate costly, time consuming, high maintenance, mold-damaging mechanical and/or chemical cleaning method and apparatus by substituting a highly effective method and apparatus for reverse sputtering to clean molds prior to reuse in a plastic encapsulation system.

It is still a further object of the present invention to provide an improved reverse sputtering process and apparatus for the uniform and controlled removal of surface contaminates from selected surface areas of molds used in a plastic encapsulation operation.

It is still a further object of the present invention to apply reverse sputtering to remove surface contaminates including residue plastic material, oxides, and the like from small, confined recesses in a mold surface which are difficult to clean by conventional mechanical/chemical cleaning techniques.

It is still a further object of the present invention to provide a method and apparatus for cleaning mold assemblies by a reverse sputtering operation thereby prolonging the life of the mold assembly, increasing the cleanliness of the surface, and greatly reducing the number of defective parts formed by the mold assembly.

The present invention teaches a method and apparatus for cleaning at least selected surface areas of a mold assembly by reverse sputtering techniques.

The system of the present invention teaches a method of cleaning molds, and more specifically, the top and bottom mold portions used to encapsulate lead frame assemblies in a plastic material including the steps of providing a vacuum chamber; transporting a mold portion to be cleaned to the vacuum chamber; evacuating the chamber; admitting an ionizible gas into the vacuum chamber; and bombarding the mold surface to be cleaned with ions for removing surface contaminates, and the like, by reverse sputtering.

The method may include the additional steps of providing an anode, providing a cathode, and/or coupling the mold to be cleaned as the cathode or proximate to the cathode; establishing an electrical potential between the anode and the cathode; initiating and sustaining a sputter discharge within the vacuum chamber; and cleaning the desired surface areas of the mold by ion bombardment with ions accelerated by the electric potential.

Furthermore, the method may include the steps of shielding portions of the mold surface from undesired sputtering. Further, the step of transporting the cleaned mold out of the vacuum chamber can be added and can include the step of reducing the vacuum, opening the chamber, and removing the cleaned mold.

The present invention also contemplates the improvement in the method for encapsulating the circuit portion of an integrated circuit operably disposed in a lead frame to form a lead frame assembly with a plastic material including the steps of accurately positioning the lead frame assembly in the lower mold portion, placing the upper mold portion thereover, feeding plastic material into the mold cavity; heating and applying pressure to the plastic material to create a flow of molten plastic over the area to be encapsulated; curing the encapsulated portion; separating the upper and lower mold portions; cleaning the mold portions prior to reuse; and subsequently processing the removed encapsulated lead frame assemblies. The improvement contemplated is within the cleaning step and includes transporting the separated mold portions and reverse sputtering the mold portions for cleaning at least selected surfaces thereof prior to mold reuse.

The improved process also contemplates providing a vacuum chamber, and the reverse sputtering operation contemplates evacuating the chamber, introducing an ionizible gas into the chamber, creating an electric field between a pair of electrodes, and bombarding the surface of the mold to be cleaned for removing impurities including excess portions of plastic, oxides, and similar surface contaminates.

The improved method may further include providing an anode, providing the mold as a cathode, and creating an electrical field between the anode and the cathode. And it may also include providing an anode and a cathode, and positioning the mold at a selective location between the anode and cathode for optimum cleaning.

Yet further, the improved method may include creating a plasma or glow discharge field between the cathode and anode or such steps as reducing the vacuum, opening the chamber, and removing the clean mold for subsequent reuse. Further, the method may include the step of selectively masking or shielding predetermined portions of the mold surface which are not to receive ion bombardment to prevent damage thereto.

The present invention also contemplates an improved system for continuously encapsulating the integrated circuit and lead portion of a lead frame assembly including means for positioning a lead frame assembly within a lower mold portion, means for positioning the upper mold portion over the lower mold portion to form a complete mold assembly, means for supplying a plastic encapsulating material into the mold cavity; means for heating the mold and applying pressure to supply the molten plastic material to all portions to be encapsulated; means for curing the encapsulated material; means for separating the upper mold portion from the lower mold portion; means for removing the encapsulated lead frame assembly from the lower mold portion; means for at least one of physically and chemically removing at least a portion of excess plastic material from the upper and lower mold portion surfaces; and means for repositioning the cleaned mold portions for subsequent reuse. The improvement in the system resides in the means for at least one of physically and chemically removing the excess plastic material and residue therefrom and includes improved cleaning means for cleaning any remaining plastic material, plastic residue, and other surface contaminates such as oxidation products, $CF_4$, dust, grease, oil, and the like and includes an enclosure means and means for positioning a mold portion to be cleaned within the enclosure means. A means for producing a substantial vacuum within the enclosure is provided and means for introducing an ionizible gas into the chamber. Means for generating a plasma field for bombarding selected surfaces of the mold portion to be cleaned with ions for reverse sputtering to remove surface contaminates is also provided.

Additionally, the plasma field generating means may include an anode means, a cathode means which may include the mold portion or exclude the mold portion, means for initiating and sustaining a reverse sputtering operation for eliminating contaminates, and the like. Additionally, means may be provided for transporting the mold assemblies to the vacuum chamber, for transporting the mold assemblies from the mold assembly, for maintaining the operation of the encapsulating process as a continuous, in-line process, or for maintaining the operation of the encapsulating process as a step-by-step, in-line process wherein the mold assemblies are reused after cleaning and heater case.

Other advantages and meritorious features of the present invention will be more fully understood from the following description of the drawings and the preferred embodiment, the appended claims and the drawings which are described briefly hereinbelow.

DESCRIPTION OF THE PREFERRED EMBODIMENT

Figure 1:
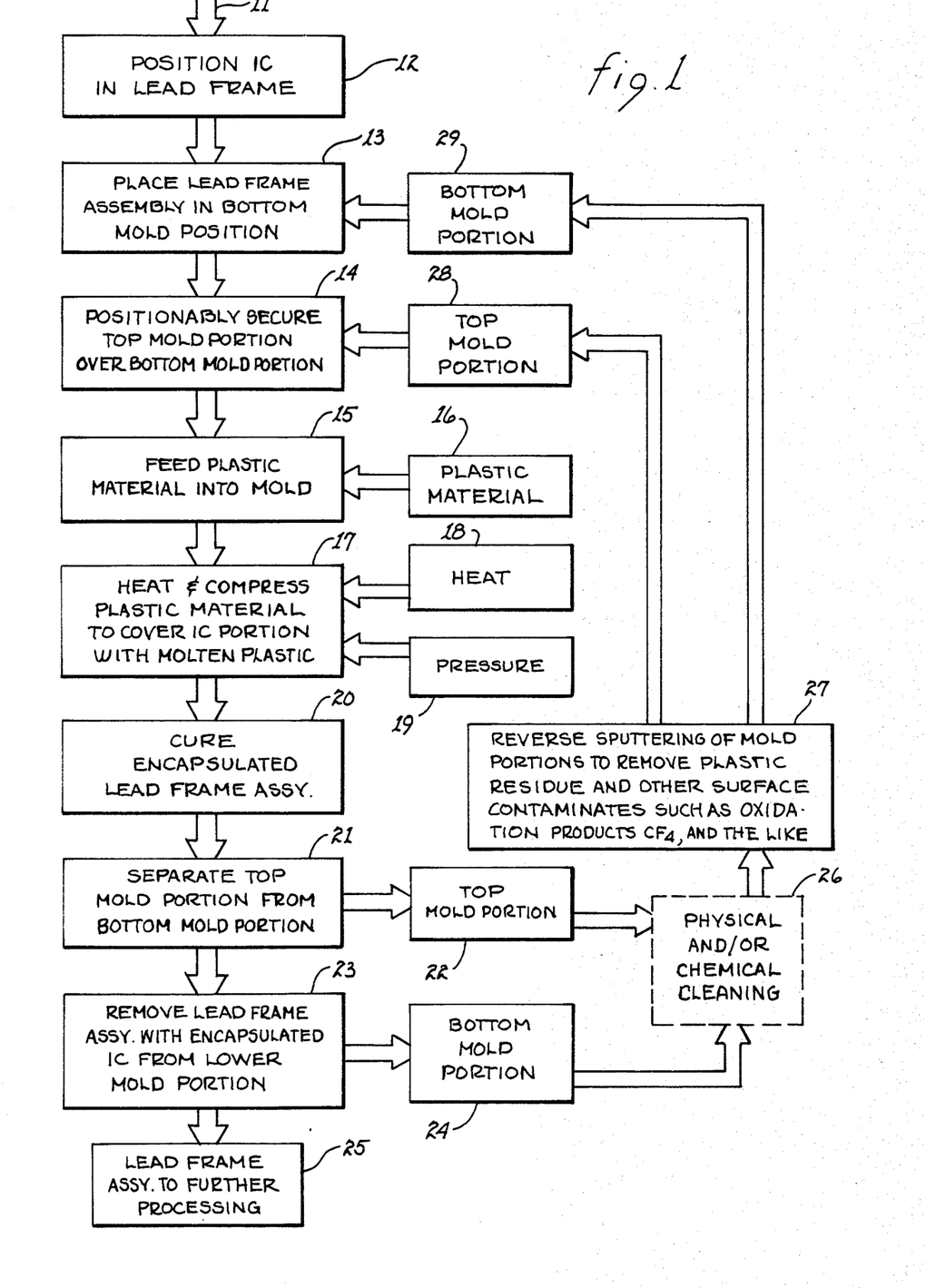
FIG. 1 is a flow diagram, in block form, illustrating a continuous, in-line plastic encapsulation process employing the improvement of the present invention.

FIG. 1 illustrates the encapsulation portion of a process for making a semiconductor package. The input 11 to the system represents the input from previous prior art method steps for making an integrated circuit and for making a lead frame structure. Block 12 represents the step of positioning an integrated circuit in the central portion of the lead frame and electrically coupling the inputs and outputs of the integrated circuit to the corresponding leads of the lead frame. Block ]3 represents the step of placing the lead frame assembly in the bottom mold portion, while step 14 represents positionably securing the top mold portion over the bottom mold portion to form a complete mold structure about the lead frame apparatus. Block 15 represents the step of feeding, supplying or injecting plastic material into the central cavity of the mold, while step 16 represents the source of plastic material so injected. Block 17 represents the steps of heating and compressing the plastic material within the mold cavity to cover the integrated circuit and lead portions of the lead frame assembly with molten plastic material. Block 18 represents a source of process heat while block 19 represents a source of pressure.

Block 20 represents the step of curing the encapsulated lead frame assembly, and block 21 represents the step of separating the top mold portion from the bottom mold portion. Step 22 represents the top mold portion having been removed or separated from the bottom mold portion and being transported to a cleaning operation. Block 23 represents the step of removing the lead frame assembly with the encapsulated integrated circuit and lead portion from the lower mold portion, and block 24 represents the bottom mold portion being transported to a cleaning operation. Block 25 represents any further processing of the encapsulated lead frame assembly such as bending the lead pins or terminals to a desired angle; Dip soldering, storage, or the like, as known in the art.

The cleaning operation represented by dotted block 26 may be included or excluded from the process, depending upon the needs of the system, and represents at least some of the physical and/or chemical cleaning operations of the prior art. The present system contemplates performing the mechanical and/or cleaning operation where required or completely bypassing dotted block 26 by supplying the top mold portion of block 22 and the bottom mold portion of block 24 directly into the reverse sputtering operation represented by block 27. Block 27 represents the step of reverse sputtering of at least selected surface portions of the mold to remove plastic material, plastic residue, and other surface contaminates such as dirt, oil, grease, dust, and the like plus such contaminates or impurities as oxidation products, oxides, sulfides, and the like as well as $CF_4$, etc. The output of the sputtering operation of block 27 supplies the top and bottom mold portions cleaned and ready for reuse to the bottom mold portion position or step of block 29 and the top mold portion located or step represented by block 28.

In operation, the process of FIG. 1 represents a continuous, or alternately a step-by-step, in-line process whereby encapsulated lead frame assemblies are continuously produced and both top and bottom mold portions are cleaned after use and recycled for subsequent reuse to maintain the continuity of the process.

Figure 2:
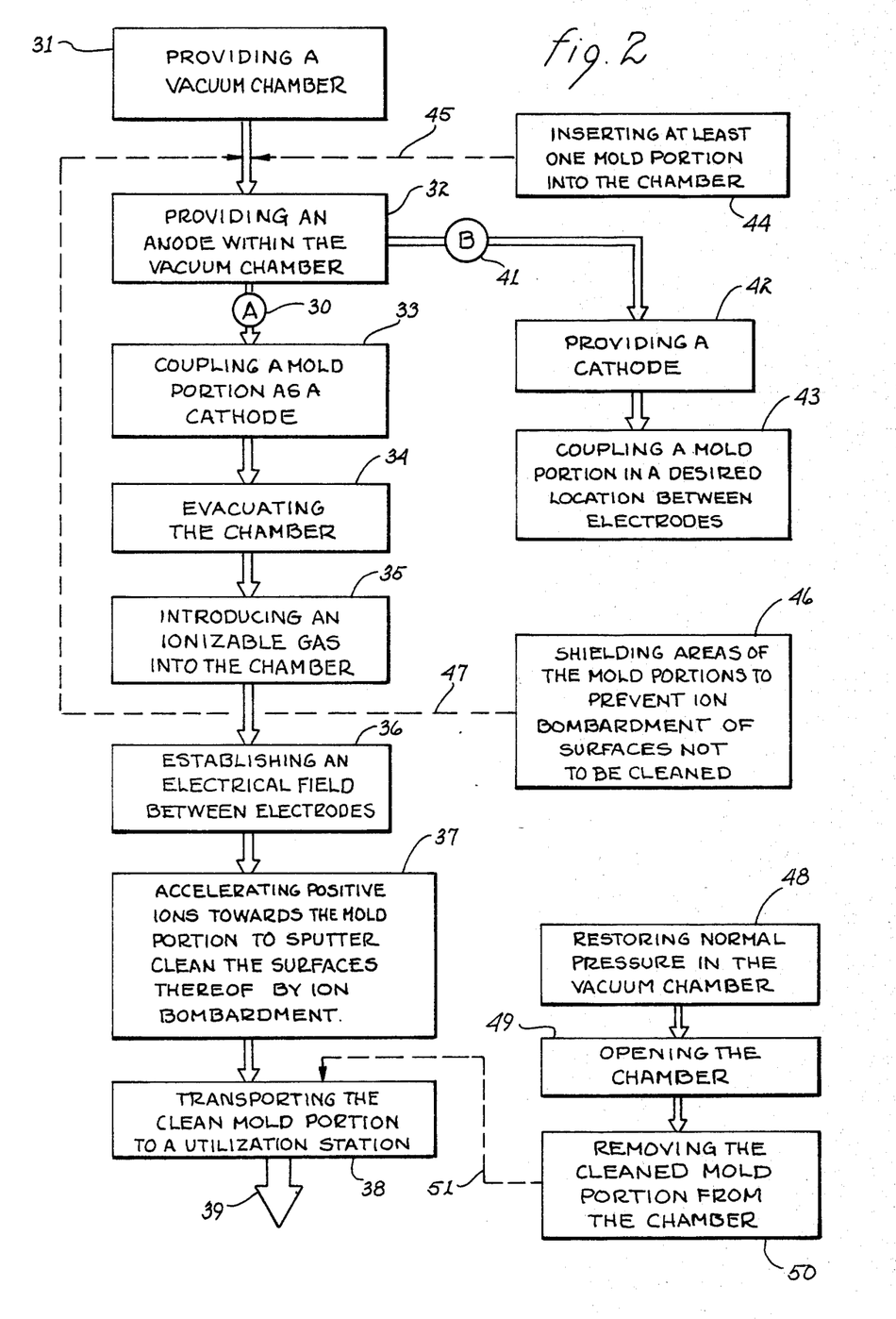
FIG. 2 is a flow diagram, in block form, illustrating the reverse sputtering improvement operation of the block diagram of FIG. 1.

FIG. 2 illustrates, in greater detail, the process represented by the reverse sputtering operation of block 27 of FIG. 1. In FIG. 2, the reverse sputtering operation of block 27 is shown to include the step of providing a vacuum chamber as represented by block 31, and providing an anode within the vacuum chamber is shown by block 32. A first process path represented by the encircled "A", assigned reference numeral 30, proceeds to the step of coupling the mold portion as a cathode electrode as represented by block 33, and then evacuating the vacuum chamber in accordance with block 34. The system then proceeds to introduce an ionizible gas into the vacuum chamber as illustrated by block 35, and then establishing an electrical field between the electrodes to produce a glow discharge or plasma therebetween, as represented by block 36.

The step of accelerating positive ions toward the mold portion to be cleaned by ion bombardment is represented by block 37, and the step of transporting the cleaned mold portion to a utilization station is represented by block 38. The output arrow 39 represents subsequent operations involving the clean mold portions such as the recycling or the reuse of the molds in the in-line process of FIG. 1.

Block 44 represents the step of inserting at least one mold portion into the vacuum chamber while dotted arrow 45 represents that the step of block 44 is an alternate embodiment which may or may not be included prior to the step of providing an anode within the vacuum chamber as per block 32. Similarly, the step of shielding selected areas of the mold portion to prevent ion bombardment of surfaces not to be cleaned is represented by block 46 and dotted arrow 47 indicates that the step is an alternate embodiment which may be added to the process prior to the step of providing an anode of block 32.

The alternate or second process path from the step of providing an anode of block 32 is represented by the encircled "B", assigned reference numeral 41, which proceeds to the step of providing a cathode as illustrated by block 42. The step of providing a cathode if followed by the step of coupling a mold portion in a desired location between the anode and cathode electrodes as represented by block 43, and the process then comes back to the step of evacuating the chamber represented by block 34.

Lastly, the alternate steps of restoring normal pressure to the vacuum chamber is represented by block 48; opening the chamber is represented by block 49; and removing the cleaned mold portion from the vacuum chamber is represented by block 50. These steps are shown as an alternate process designation which may be introduced via dotted lead arrow 51 prior to the transporting step of block 38.

In summary, the reverse sputtering operation of FIG. 2 and the various alternate embodiments represented thereby, provides a high efficient, low-cost system for reverse sputter cleaning selected surface areas of the mold portion so that they can be reused in a continuous, in-line molding or encapsulating process.

Figure 3:
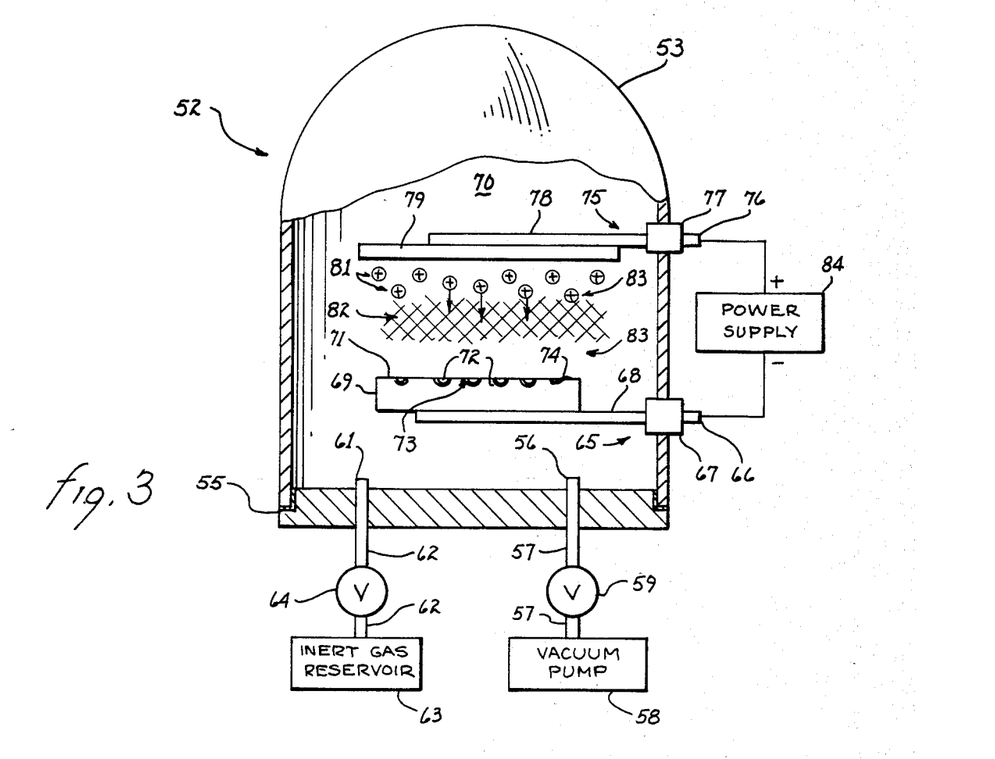
FIG. 3 is a diagrammatic representation of a simplified form of an apparatus for practicing the improvement of the present invention and illustrating the environment in which the process could be carried out.

FIG. 3 is a diagrammatic representation of a vacuum system illustrating the concept of the present invention and the environment in which the process is undertaken. FIG. 3 illustrates the reverse sputtering apparatus 52 of the present invention and includes a vacuum chamber, vacuum enclosure, or bell jar 53 having a support plate 54 and an annular vacuum-tight seal 55. The support plate 54 includes a vacuum port 56 operably coupled through a conduit 57 to a vacuum pump 58. The conduit 57 includes, interposed therein, a vacuum pressure valve and meter 59, as known in the art. Controlled amounts of the atmosphere within the bell jar 53 can be removed by the vacuum pump 58 through the port 56 and conduit 57 to produce any degree of vacuum therein.

The base 54 also includes an inert gas portion 61 connected via conduit 62 to an inert gas reservoir 63. Interposed in the conduit 62 is an inert gas valve and meter 64 which can be used to control the amount of inert gas admitted to the vacuum chamber 53. The inert gas valve and meter 64 may be, for example, any type of well-known micrometer needle valve such as a Whitney micrometer needle valve, or the like, but regardless of the type of valve used, it must be capable of measuring relatively low pressures.

The reverse sputtering apparatus 52 of FIG. 3 also includes a hollow cathode holder assembly 65 having a high voltage feedthrough terminal 66, a seal portion 67, and a hollow cathode support or holder portion 68. The support 68 is adapted to hold a cathode, such as the particular upper or lower mold portion to be cleaned and is represented by reference numeral 69. The mold surface 71 to be cleaned may include mold recesses, indentations, and similar small, hard-to-reach mold cavities, and the like as represented by reference numerals 72. Similarly, the surface 71 may include contaminates 73 and materials such as excess plastic residue 74.

The apparatus 52 further includes an anode holder assembly 75 having a high-voltage feedthrough electrode 76, a seal 77, and a hollow anode support or holder 78. The anode support 78 houses, positions or operably disposes an anode 79 within the hollow interior of the vacuum chamber 53 spaced apart from the cathode or mold portion 69.

A portion intermediate the anode electrode 79 and cathode electrode or mold 69 is represented by the diagonal lines 82 illustrating a glow discharge or plasma area within the electric field established between the anode 79 and cathode 69. Positive ions 81 are produced by the electric field between the anode 79 and cathode 69 ionizing the ionizible gas 70 provided from the gas reservoir 63 and these positive ions are accelerated by the electric field established between the anode 79 and cathode 69 toward the surface 71 of the cathode 69 to bombard the surface for cleaning both the surface 71 and the recesses 72. The reference numeral 83 represents the well-known "dark space" on either side of the discharge area 82 and may be significant for locating or positioning the mold separate and apart from an individual cathode, if desired. A DC power supply 84 may be operably connected so that the positive terminal is connected via feedthrough electrode 76 to the anode 79 while the negative terminal is connected through the feedthrough electrode 66 to the cathode 69.

While various inert gasses may be used within the sputtering apparatus 52, it is preferred that a totally inert gas be used wherever possible. The preferred gas of the present invention is argon. Selectively, a desired pressure of approximately $5 \times 10^{-6}$ millimeters of mercury is established although higher or lower pressures can be used depending upon the particular application, the size of the surface areas to be cleaned etc. Further, while any inert gas can be used to form the ionizible atmosphere 70 within the bell jar or vacuum chamber 53, argon is preferred since it is a "heavy" gas and provides a relatively large mass of ions compared to other inert gasses which could be used for reverse sputtering. Since the greater number of ions, the greater the reverse sputtering or cleaning action, argon has been selected in the present example.

The power supply 84 preferably produces a DC voltage in a range between 1000 and 2000 volts although the voltage may be increased or decreased, as desired, depending upon the current required and the period of time during which the glow discharge or plasma must be sustained for complete and thorough cleaning.

The operation of the reverse sputtering system 52 of FIG. 3 will now be briefly described. The vacuum jar is provided with electrode 79 and the mold 69 is positioned on the cathode holder 68 to form the cathode 69 shown in FIG. 3. Alternately, a separate cathode may be positioned on the holder 68 and the mold 69 positioned at a desired location between the anode 79 and new cathode positioned on the holder 68 so as to permit maximum cleaning of the mold surfaces.

In either case, however, the chamber 53 is then closed, the vacuum pump 58 draws the atmosphere therefrom, and an inert gas is introduced from the reservoir 63 to form an ionizible gas 70 within the vacuum chamber 53. A source of DC potential 84 establishes an electrical potential or field between the anode 79 and the cathode 69 and the field sustains ionization of the inert gas and creates a glow discharge, arc discharge, or plasma in a portion of the area between the anode 79 and the cathode 69. As the gas ionizes, positive ions are accelerated by the electric field through the plasma to bombard the selected surface areas 71 of the mold and the recesses 72 therein to clean or strip off impurities, surface contaminates and the like to complete the reverse sputtering cleaning operation. When cleaning is finished, the vacuum pump 58 reestablishes atmosphere in the chamber 53, the vacuum chamber is opened and the mold 69 removed for subsequent reuse as illustrated in the process steps of FIGS. 1 and 2.

While the reverse sputtering apparatus 52 is illustrated in FIG. 3 as a bell jar, for sake of simplicity, it will be understood that a continuous or in-line reverse sputtering operation may require apparatus totally different in shape or appearance, or even separate systems for top and bottom mold portions could be used in actual practice. FIG. 3 is for illustrative purposes only and is not to be taken as definitive of the structure of the reverse sputtering apparatus contemplated by the present invention.

Figures 4, 5:
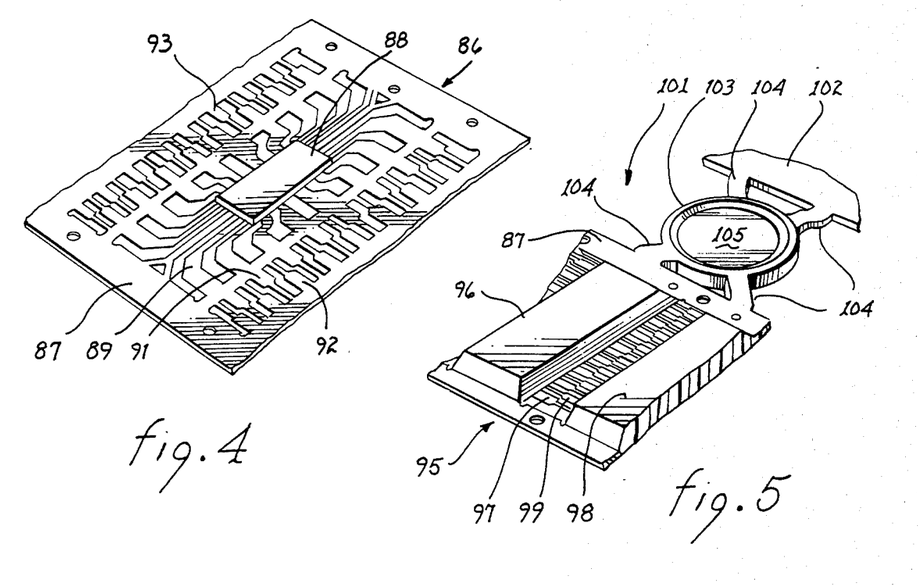
FIG. 4 is a partial perspective view of a lead frame assembly to be encapsulated by the system of FIG. 1.
FIG. 5 is a perspective view, partially broken away, of a portion of an encapsulated lead frame assembly produced by the process of FIG. 1.

FIG. 4 illustrates a lead frame assembly 86 of the present invention and is shown as including a lead frame 87 with an integrated circuit 88 operatively secured, mounted, or disposed proximate the center of the lead frame 87. In fact, the integrated circuit portion 88 is electrically coupled or connected to the plurality of input/output leads 89 which terminates in the lead pins or connectors 91. Adjacent lead pins on one side are represented by reference numeral 92 and are associated with an adjacent integrated circuit portion, now shown, while adjacent lead pins 93 on the opposite side are associated with a second adjacent integrated circuit portion, not shown. As can be seen in FIG. 4, the lead frame assembly 86 actually includes many individual lead frame subassemblies each of which includes its own integrated circuit or circuit portion and a plurality of leads terminating in lead pins, terminals or connectors.

FIG. 5 illustrates a portion of the lead frame apparatus 86 of FIG. 4 after the encapsulation process, and is designated as an encapsulated lead frame apparatus 95. The apparatus 95 includes a plastic encapsulated portion 96 operably disposed over the integrated circuit portion 88 and lead portion 89 of the lead frame assembly 86 of FIG. 4 so that only the lead pins or terminals 97 protrude from the encapsulating plastic material 96. The apparatus 95 is shown as including the lead frame portion 87, and the lead pins 97. Similarly, since many similar circuits are made and encapsulated at once, the adjacent lead pins 99 are shown with a portion of the encapsulated circuit portion 98.

Further, FIG. 5 shows some of the residue or overflow plastic material produced by the molding apparatus between adjacent lead frames. The lead frame 102 is shown as being connected to the lead frame 87 through a plastic residue connector 101. The connector 101 includes an annular ring portion 103, a plurality of connecting legs 104, and a central aperature 105. All of this plastic material must be broken away and separated from the lead frames before use. Similarly, the lead frames themselves are separated so that the individual sets of lead pins are associated with their respective encapsulated circuit portions resulting in individual circuit packages such as dual inline semiconductor, etc.

Figures 6, 7:
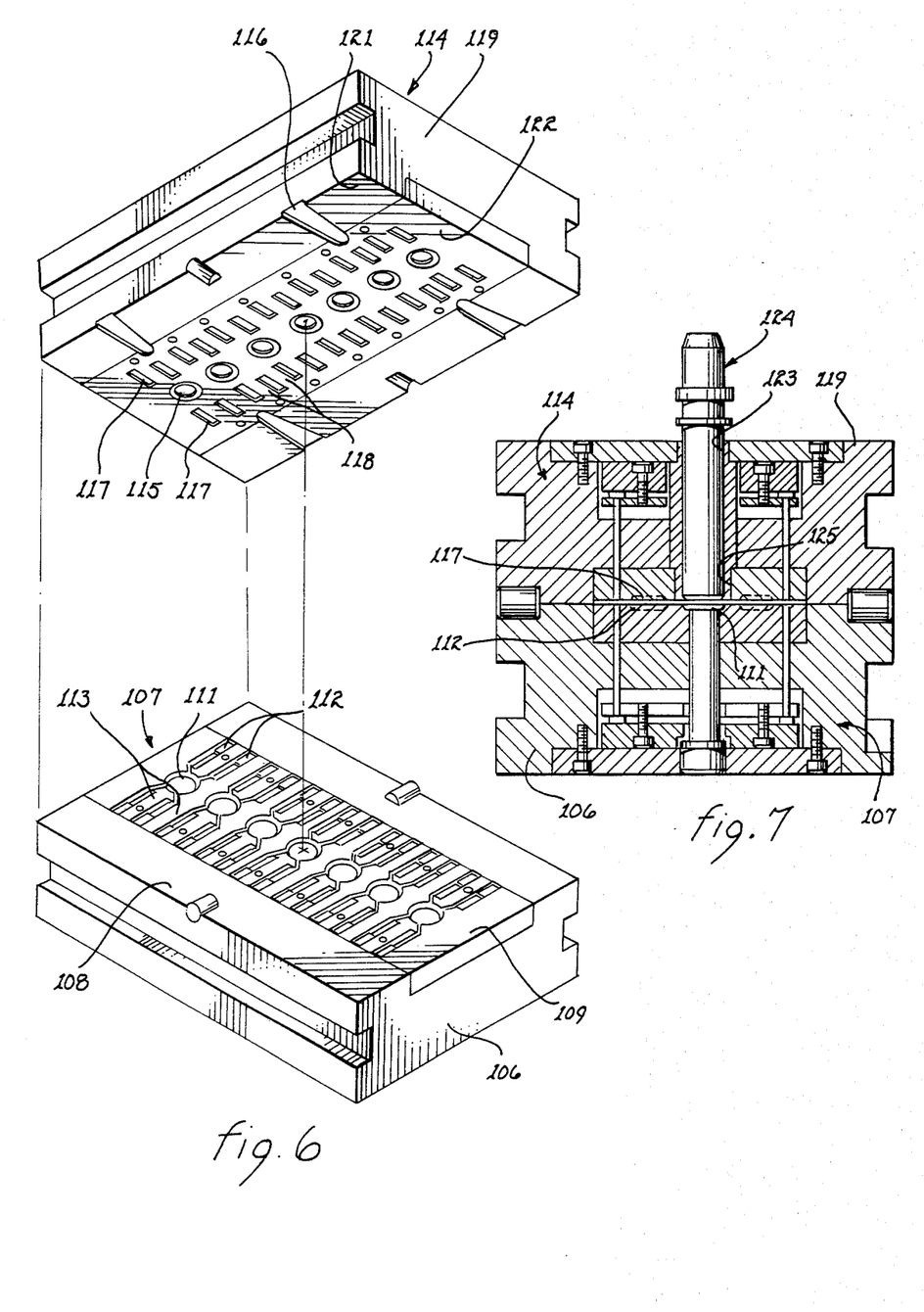
FIG. 6 is a perspective view of the top and bottom mold portions used to produce the encapsulated lead frame assemblies of the process of FIG. 1.
FIG. 7 is a sectional view taken through the upper and lower mold assemblies of FIG. 6 with the mold assemblies in a closed position and secured to one another as seen during the encapsulation process.

FIG. 6 shows the lower mold portion 107 and the upper mold portion 114. The lower mold portion 107 is shown as including a mold body portion 106, a mold body surface 108, and a lead frame mold surface 109. A plastic residue recess is represented by reference numeral 111 and forms the residue connector 103 of FIG. 5 as previously described. The lead frame recesses 112 house the adjacent lead frame portions while the intermediate mold surfaces 113 are disposed between adjacent lead frames.

The upper mold portion 114 includes an upper mold body portion 119 having a mold surface 121. Further, the upper mold body portion 119 houses a lead frame surface 122 having a plurality of lead frame recesses 117 operably disposed therein. The recesses 115 correspond to the recesses 111 of the bottom mold portion 107 and perform a similar function. Side recesses 116 in the surface 121 are provided as are intermediate surface portions 118 between adjacent lead frame recesses 117.

The upper mold portion 114 may be operably disposed upon the lower mold portion 107 once the lead frames are operably positioned or disposed therein and secured as shown in FIG. 7.

FIG. 7 is meant to illustrate the closed mold assembly used for encapsulating the lead frame assemblies previously described, and is shown as including the lower mold portion or assembly 107 having a mold body 106 and the upper mold portion or assembly 114 having a body portion 119. The lead frame recess 112 of the lower or bottom mold portion 107 is operably disposed immediately under the corresponding recess 117 of the upper or top mold portion or assembly 114. A central connecting ring producing cavity 111 is shown as is a collar portion 125 having an inside tubular channel or cylindrical portion 123 for housing a pressure member 124. The mold assembly of FIG. 7 could, for example, have been supplied with plastic material through the channel 123 and been heated while pressure is applied by member 124 to melt the plastic material and cause it to flow through the varous recesses of the mold for producing the desired encapsulation.

It is the excess encapsulation material and the plastic residue adhering to or even chemically uniting with the various surface portions of the mold which must be removed by the reverse sputtering operation of the present invention before the mold portions can be reused in the continuous in-line encapsulating operation of the present invention.

The incorporation of the reverse sputtering apparatus into the system of the present invention and/or the incorporation of the method of cleaning the various mold surfaces by reverse sputtering techniques enables the molds to be used in a continuous in-line process for encapsulating lead frames or any semiconductor component while insuring the quality of cleanliness required for such devices, the speed required for the continuous operation, and the economy required for effective competition.

While specific apparatus and method steps have been described for the purpose of illustrating the preferred embodiment of the present invention, it will be readily apparent to those of ordinary skill in the art there are various modifications and changes that can be made in both the apparatus and method disclosed herein without departing from the spirit and scope of the present invention which is limited only by the appended claims.

We claim:

1. A method of cleaning molds comprising the steps of:
   providing a vacuum chamber;
   transporting a mold to be cleaned to the vacuum chamber;
   evacuating the chamber;
   admitting an ionizible gas to the vacuum chamber; and
   bombarding the mold surfaces to be cleaned with ions for removing surface contaminates by reverse sputtering.

2. The method of claim 1 wherein the step of bombarding the mold surfaces to be cleaned includes the steps of:
   providing an anode;
   electrically coupling the mold to be cleaned as a cathode;
   establishing an electrical potential field between the anode and cathode for sustaining a glow discharge within the vacuum chamber;
   ionizing the gas within the vacuum chamber; and
   accelerating the positive ions toward the cathode for cleaning the surface thereof by ion bombardment.

3. The method of claim 2 further including the step of selectively shielding portions of the mold from undesirable ion bombardment.

4. The method of claim 3 further including the step of restoring the atmosphere to the vacuum chamber; opening the vacuum chamber; and removing the cleaned mold from the vacuum chamber.

5. The method of claim 1 wherein said step of bombarding the mold surfaces includes the steps of:
   providing a cathode spaced a predetermined distance from said anode;
   coupling the mold to be cleaned at a predetermined position between the anode and the cathode;
   applying a D.C. electrical potential between the anode and cathode for establishing and sustaining a plasma therebetween;
   ionizing the gas introduced into the vacuum chamber; and
   accelerating the positive ions toward the surface of the mold to be cleaned by the electrical field established between the anode and cathode.

6. The method of claim 5 further including the step of selectively masking portions of the mold surface to prevent undesirable reverse sputtering thereof.

7. The method of claim 5 further including the steps of:
   restoring normal atmospheric pressure to the vacuum chamber;
   opening the vacuum chamber; and
   removing the cleaned mold for subsequent reuse.

8. In a method for encapsulating the integrated circuit and input/output lead portion of a lead frame assembly within a plastic encapsulating material including the steps of accurately positioning a lead frame assembly within the lower mold portion, placing the upper mold portion over the lower mold portion, feeding plastic material into the mold cavity, heating and applying pressure to the plastic material for melting same and causing the plastic material to flow over the portions to be encapsulated, curing the encapsulated lead frame assemblies, separating the upper and lower mold portions, cleaning the separated mold portions, and subsequently reusing the cleaned mold portions in a continuous encapsulating process, the improvement residing in said cleaning step and comprising:

transporting the upper and lower mold portions to be cleaned to a cleaning station; and
   reverse sputtering the mold portions to clean surface contaminates and the like therefrom prior to reuse.

9. The improved method of claim 8 wherein the step of reverse sputtering further includes the steps of:
   providing a vacuum chamber;
   positioning the mold portion to be cleaned within the vacuum chamber;
   evacuating the chamber;
   introducing an ionizible inert gas into the vacuum chamber;
   creating a plasma field between a pair of electrodes; and
   bombarding the surface of the mold to be cleaned with ions for removing impurities and surface contaminates therefrom.

10. The improved method of claim 9 wherein the step of reverse sputtering further includes the steps of:
    providing an anode;
    connecting the mold to be cleaned as a cathode;
    establishing an electrical field between the anode and cathode for establishing said plasma field; and
    accelerating the generated positive ions toward the cathode for cleaning purposes.

11. The improved method of claim 9 wherein said reverse sputtering step further includes the steps of:
    providing an anode;
    providing a cathode;
    positioning the mold between the anode and cathode at a predetermined location for maximizing cleaning efficiency;
    establishing a DC potential between the anode and cathode to create an electrical field therebetween for generating said plasma;
    ionizing said gas; and
    accelerating the positive ions toward the selected mold surfaces to be cleaned.

12. Improved method of claim 11 further including the step of selectively masking portions of the mold surface upon which ion bombardment is undesirable.

13. The improved method of claim 10 further including the step of selectively shielding predetermined surface areas of the mold portion to be cleaned from the ion bombardment produced by reverse sputtering.

14. In a system for continuously encapsulating the integrated circuit portion and input/output lead portion of a lead frame assembly including means for locating the lead frame assembly in a lower mold portion, means for positioning and securing an upper mold portion over said lower mold portion to form a mold assembly, means for supplying plastic encapsulating material into a mold cavity of the mold assembly, means for heating and pressurizing the plastic material for flowing the molten plastic over the portions of the lead frame assembly to be encapsulated, means for curing the encapsulated lead frame assembly, means for separating the upper mold portion from the lower mold portion, means for removing the encapsulated lead frame assembly from the lower mold portion, and means for cleaning the mold portions prior to subsequent reuse, improved cleaning means for removing the remaining plastic material, plastic residue, and surface contamination such as dirt, oil, grease, dust, oxidation products, $CF_4$, and the like from at least selected surfaces of the mold portions prior to subsequent reuse comprising:

vacuum enclosure means;
    means for positioning a mold portion to be cleaned within said vacuum enclosure means;
    means for producing a substantial vacuum in said vacuum enclosure means;
    means for introducing an inert ionizible gas into said vacuum chamber
    means for generating a plasma field within said vacuum chamber for ionizing said gas; and
    means for bombarding the selected surface areas of the mold portions to be cleaned with ions for removing the surface contaminates therefrom.

15. The improved system of claim 14 wherein said means for generating a plasma field includes:
    anode means;
    cathode means including said mold portion to be cleaned; and
    means for generating an electrical field between said anode and said cathode to initiate and sustain said plasma to enable the reverse sputtering operation to clean the surface contaminates from said mold portion.

16. The system of claim 15 further including means for transporting said mold portions to be cleaned to said vacuum chamber and means for transporting said cleaned mold assemblies from said vacuum chamber to a station for subsequent reuse.

17. The improved system of claim 16 wherein said system further includes means for selectively shielding selected surface areas of said mold portions for masking same from the reverse sputtering operation.

18. The improved system of claim 14 wherein said plasma generating means includes:
    anode means;
    cathode means spaced apart from said anode means;
    means for selectively positioning said mold portion to be cleaned at a predetermined location between said anode means and said cathode means for maximum cleaning efficiency; and
    means for generating an electrical field between the anode and cathode to initiate and sustain a reverse sputtering operation for cleaning at least selected surface areas of said mold portion to be cleaned by ion bombardment.

19. The improved system of claim 18 further including means for transporting mold portions to be cleaned to said vacuum chamber and means for transporting cleaned mold portions to a work station for subsequent reuse.

20. The improved system of claim 17 further including means for selectively masking portions of the mold surface to prevent ion bombardment during the reverse sputtering operation.

* * * * *